US011121680B1

(12) United States Patent
Ma et al.

(10) Patent No.: US 11,121,680 B1
(45) Date of Patent: Sep. 14, 2021

(54) ALL-DIGITAL TRANSMITTER WITH WIDEBAND BEAMFORMER

(71) Applicant: Mitsubishi Electric Research Laboratories, Inc., Cambridge, MA (US)

(72) Inventors: Rui Ma, Cambridge, MA (US); Sravan Kumar Pulipati, Miami, FL (US)

(73) Assignee: Mitsubishi Electric Research Laboratories, Inc., Cambridge, MA (US)

(*) Notice: Subject to any disclaimer, the term of this patent is extended or adjusted under 35 U.S.C. 154(b) by 0 days.

(21) Appl. No.: 16/833,705

(22) Filed: Mar. 30, 2020

(51) Int. Cl.
*H03H 17/02* (2006.01)
*H03F 3/195* (2006.01)
*H03F 3/24* (2006.01)

(52) U.S. Cl.
CPC .............. *H03F 3/195* (2013.01); *H03F 3/24* (2013.01); *H03H 17/0273* (2013.01); *H03F 2200/331* (2013.01)

(58) Field of Classification Search
CPC ........ H03F 3/195; H03F 3/24; H03H 17/0273; H03F 2200/331; H03H 17/0273
USPC ......................................................... 375/295
See application file for complete search history.

(56) References Cited

U.S. PATENT DOCUMENTS 10,177,776 B1 * 1/2019 Ma .............................. H03F 3/19
10,187,232 B1 * 1/2019 Ma ......................... H04L 7/0029

OTHER PUBLICATIONS

Dinis et al. (An FPGA-based Multi-level All-Digital Transmitter with 1.25 GHz of Bandwidth, 2018 IEEE/MTT-S International Microwave Symposium) (Year: 2018).*
Dinis et al. (All-digital Transmitter Based Antenna Array with Reduced Hardware Complexity, IEEE, 2017) (Year: 2017).*
Wijenayake et al. (Low-Complexity Wideband Transmit Beamforming Using Network-Resonant Digital Plane-Wave Filters, IEEE, Jul. 2018) (Year: 2018).*
Pulipati et al. (Design Considerations and FPGA Implementation of a Wideband All-Digital Transmit Beamformer with 50% Fractional Bandwidth, 2020 IEEE/MTT-S International Microwave Symposium (IMS)) (Year: 2020).*

* cited by examiner

*Primary Examiner* — Ted M Wang
(74) *Attorney, Agent, or Firm* — Gene Vinokur; Hironori Tsukamoto

(57) ABSTRACT

An all-digital transmitter (ADT) is provided. The ADS includes a baseband interface configured to store and transmit an (baseband) input signal at a corresponding frequency band, a polyphase finite impulse response filter configured to receive and convert the baseband input signal into different phases, a digital upconverter configured to upconvert each of the different phase baseband input signal to a predetermined carrier frequency in a digital domain, a set of multi-core 2-dimensional network-resonant digital plane wave beamfilters, wherein each of the multi-core 2D NR-DPW beamfilters is configured to transmit the upconverted baseband input signal by a target angle, a multi-core delta-sigma modulator configured to encode the upconverted input signal into pulsating signals, and a serializer configured to serialize the encoded pulsating signals into a RF bitstream.

14 Claims, 12 Drawing Sheets

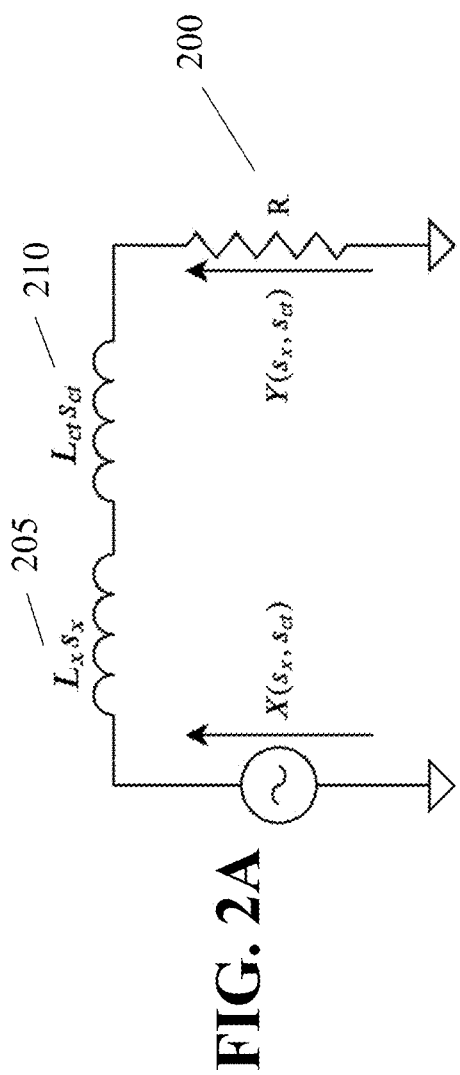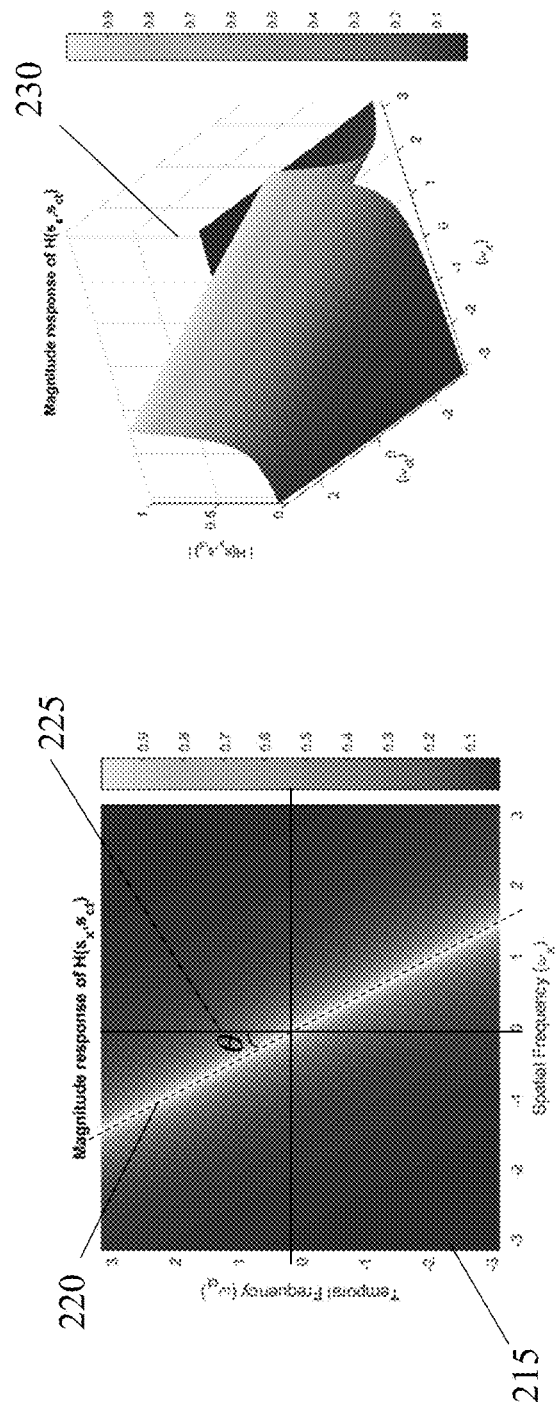
FIG. 2A
FIG. 2B
FIG. 2C

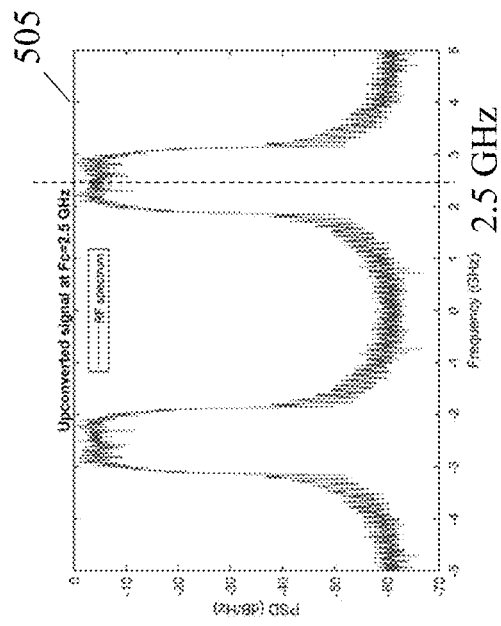
FIG. 5A
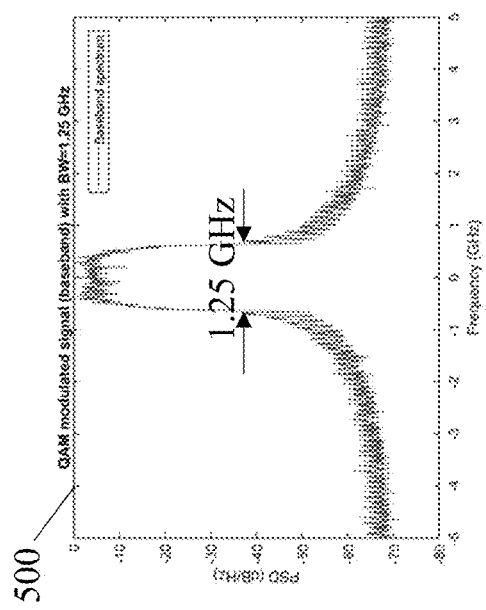
FIG. 5C
FIG. 5B
FIG. 5D
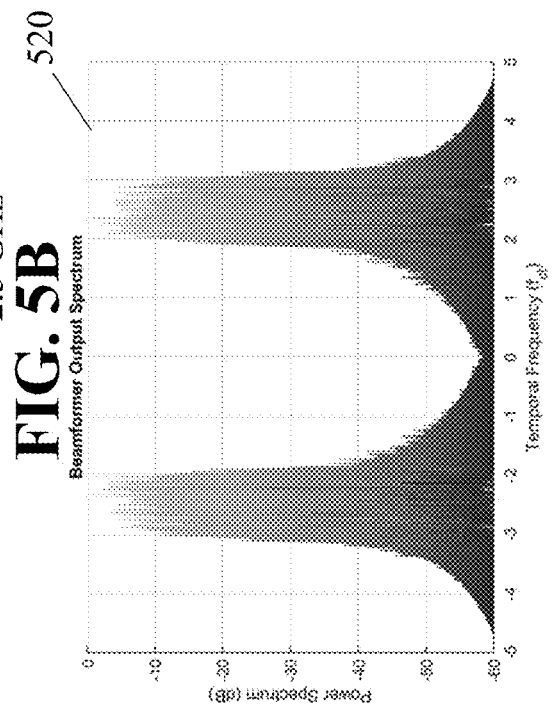

ALL-DIGITAL TRANSMITTER WITH WIDEBAND BEAMFORMER

FIELD

The present invention is generally related to beamforming applications, more specifically to an all-digital transmitter including massive phased-arrays for generating all-digital electronically steerable beams for ultra-wideband frequencies of operation.

BACKGROUND

With the rapid modernization of society, there is a huge demand for faster data rates and to support multiple users at the same time. In the past few decades, society has seen exponential growth in the field of wireless communications starting from 3G to 5G. All these advancements in the wireless field aim at providing a multitude of services that connect people and the internet of things (IoT) faster and with higher efficiency. To accommodate these requirements, the integration of massive MIMOs (multi-input multi-output) and beamforming techniques have been adopted.

These architectures require larger phased arrays and support higher bandwidth to provide lower latency, i.e., wideband beamformers. There has been a considerable amount of development on phased arrays in the past few decades. Conventional beamforming techniques employ analog phase shifters, where the signals feeding the antenna are progressively phase-shifted to form a beam in the far-field region of the array.

Currently, digital beamformers are replacing their analog counterparts due to their flexibility in providing electronically steerable beams. The digital beamformers are implemented element-wise on digital signal processor such as a field-programmable gate array (FPGA) or application specified integrated circuits (ASIC), and provide additional degrees of freedom compared to the analog beamformers. However, there are practical limitations associated in building these massive MIMOs with larger phased arrays. As the current communication technology moves into 5G and beyond, there is need of more antenna elements to provide better SNR and to serve more users simultaneously. Also scaling of arrays becomes extremely expensive for the traditional digital beamforming based array.

With significant advancement of the digital hardware platform, moving the entire phased array design to the digital domain is a viable solution and an attractive topic to explore. There has been limited prior work on implementing these All-digital architectures at the transmitter side known as All Digital Transmitters (ADT). An All-digital phased array comprising 8-elements is currently state of the art. However, this is based on CORDIC modules and provides only 25 MHz of narrow bandwidth. The wideband implementation has not yet been reported. Currently, wideband digital beamformers are based on either true-time delay, fractional FIR (finite impulse response) filters or FFT (fast Fourier transform). They are stable and provide an excellent linear response but are digitally very expensive in terms of resource occupation. Reduction in digital complexity plays a vital role to achieve the RF front-end digitization. Hence, novel architectures that are low in complexity are needed.

SUMMARY

The embodiments of the present invention provide a combined solution to above stated problems and All-digital Beamformer/phased array that includes the two architectures 1) All-digital Transmitter 2) Wideband Beamformer based on 2-D-space time filter network theory. These architectures proposed in this work reduce the hardware complexity and cost and aims at designing a wideband Beamformer with at least 25% FBW at 2.5 GHz, which is 40 times improvement to the current state of the art.

Consider FIG. 1 that shows the transition from the conventional transmit Beamformer to an all-digital transmit Beamformer. The underlying idea in developing an all-digital transmitter is by shifting as much as possible the RF components into the digital platform. It is well known that the Mixers and ADCs/DACs (Analog Digital Converters/Digital Analog Converters) are the most expensive and power-hungry components in the RF chain. Performing digital upconversion and utilizing the serializers on the FPGA platform serves a key solution. Since the output from MGTs (Multi-Gigabit Transceivers) is binary, the conventional analog Doherty power amplifiers can be replaced by digitally switched-mode power amplifiers (SMPAs) that provide greater efficiency compared to the former. The digital beamforming algorithm is integrated into the above transmitter architecture to produce an All-digital phased array.

This work contains digital beam filters based on 2-D space-time theory. The 2-D space-time filters theory was invented by Dr. Bruton and Dr. Bartley and IS IIR (infinite impulse response) filter-based and works on the theory of resonant networks. A representative network is shown in FIG. 2 A. The network resembles the conventional 1-D filter topology corresponding to temporal frequency domain $s_{ct}$, but extended to another dimension i.e., spatial dimension $s_x$. The 2-D-magnitude response $H(s_x,s_{ct})=Y(s_x,s_{ct})/X(s_x,s_{ct})$ of such a circuit is shown in FIGS. 2 B and 2C corresponding to top-view and 3D-view, respectively. In the magnitude response, the region where the magnitude is non-zero is called the ROS (Region of Support). For the given circuit, ROS lies on a straight line oriented at an angle (θ) to the $\omega_x$ axis. For an N-element uniform linear array (ULA), a beam pointing at angle ψ from the array broadside is related to angle θ by the relation tan θ=sin(ψ). It can be observed from FIG. 2B that the filter provides a beam at ψ for the entire bandwidth. Thus, the filter can be implemented digitally on an FPGA to provide beamforming for wider bandwidths.

According to some embodiments of the present invention, an all-digital transmitter (ADT) may include a baseband interface (605) configured to store and transmit an (baseband) input signal at a corresponding frequency band; a polyphase finite impulse response (FIR) filter configured to receive and convert the baseband input signal (samples) into different phases; a digital upconverter configured to upconvert each of the different phase baseband input signal to a predetermined carrier frequency in a digital domain; a set of multi-core 2-dimensional (2D) network-resonant digital plane wave (NR-DPW) beamfilters, wherein each of the multi-core 2D NR-DPW beamfilters is configured to transmit the upconverted baseband input signal by a target angle; a multi-core delta-sigma modulator (DSM) (700/930) configured to encode the upconerted input signal into pulsating signals; and a serializer (multigigabit: MGT serializer 935) configured to serialize the encoded pulsating signals into a RF bitstream.

Further, some embodiments of the present invention are based on recognition that a multi-core beamforming circuit can be provided. The multi-core beamforming circuit includes input ports configured to acquire upconverted digital signals having different phases, wherein a number of the input ports is identical to a number of the phases of the upconverted digital signals; a set of multi-core 2-dimensional (2D) network-resonant digital plane wave (NR-DPW) beamfilters connected to the input ports, wherein a number of the multi-core 2D NR-DPW beamfilters is identical to the number of phases; and output ports connected to the 2D NR-DPW beamfilters, wherein each of the output ports is connected to one of input ports of a multi-core-DSM modulator.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 2A shows a network of 2D network resonant digital plane-wave (NR-DPW) filters, according to embodiments of the present invention;

FIG. 2B shows a 2-D Magnitude response of NR DPW beamfilter, according to embodiments of the present invention;

FIG. 2C shows a 3-D view of the magnitude response of NR DPW beamfilter of FIG. 2B, according to embodiments of the present invention;

FIG. 5A is spectra of a baseband test signal with a bandwidth of 1.25 GHz, according to embodiments of the present invention;

FIG. 5B is spectra of an upconverted signal at 2.5 GHz, according to embodiments of the present invention;

FIG. 5C is spectra of 2-D NR DPW Beamformer output signal where coefficients are set to a scan angle of $\psi=30°$ degree, according to embodiments of the present invention;

FIG. 5D is spectra of the beamformer output signal strength vs the temporal frequency, according to embodiments of the present invention;

DETAILED DESCRIPTION

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

Figures 1A, 1B:
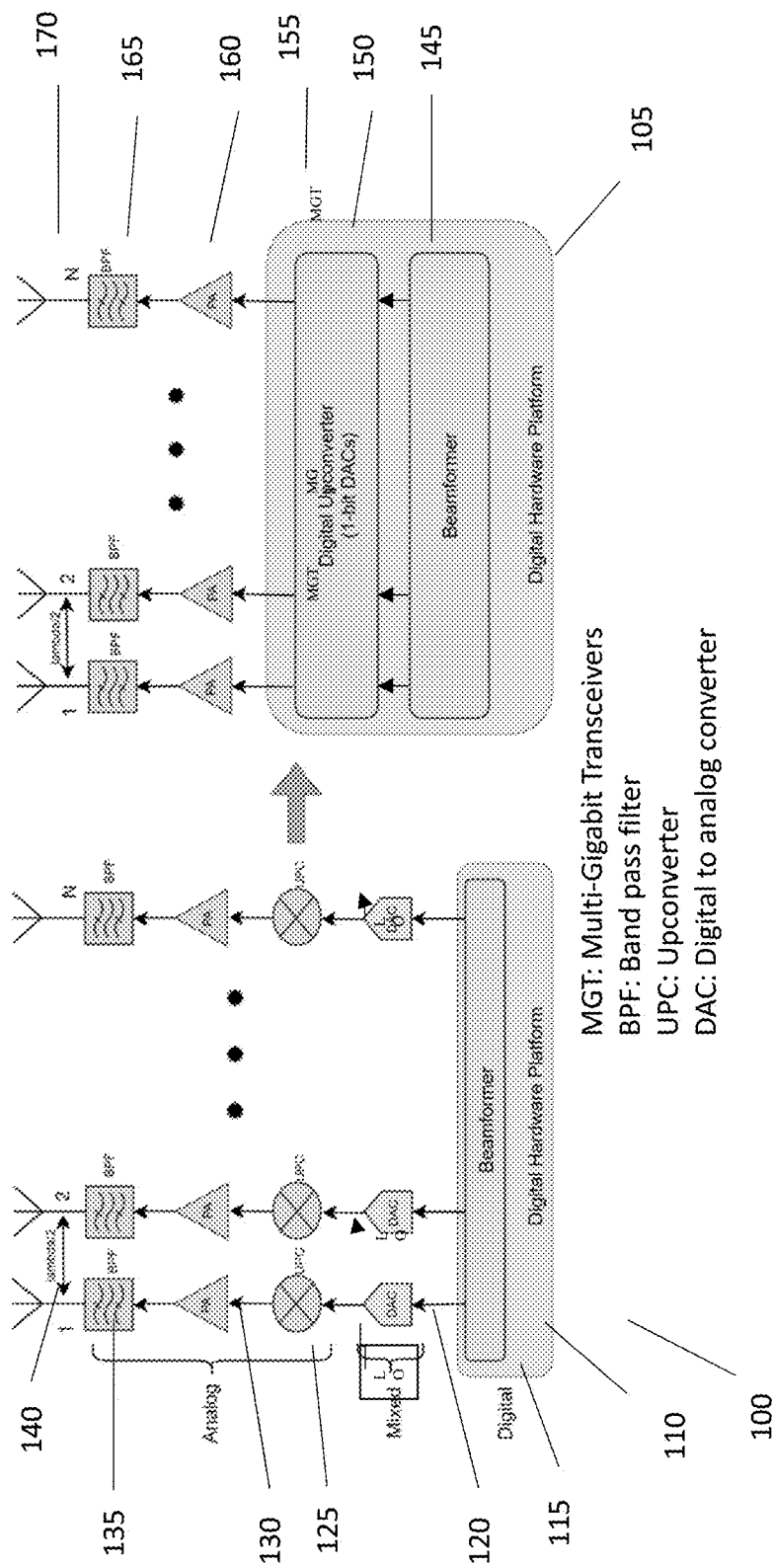
FIG. 1A is a schematic diagram illustrating is a conventional transmit digital beamformer.
FIG. 1B is a schematic diagram illustrating an All-digital transmit beamformer, according to embodiments of the present invention.

FIG. 1A shows the transition from a conventional transmit digital beamformer 100 to an All-digital Transmit Beamformer 105. Block diagram in FIG. 1A has its digital beamformer algorithm 110 implemented on the digital hardware platform 115. The digital signals are converted to analog signal through digital to analog converters (DAC) 120, and subjected to signal processing in corresponding to analog receiver chain. Each chain consists of an upconverter (UPC) 125 using mixer to modulate the baseband analog signal with the carrier frequency generated by local oscillator (LO). The upconverted signal is further processed by power amplifier 130 and band pass filter 135 to amplify the wanted signal and remove any unwanted out-of-band noise, respectively. The filtered signal modulated at the carrier frequency is finally radiated into space through the antenna radiating elements 140.

The complex and power-hungry components in the transmitter chain are the mixers and the DACs. The DACs in each transmitter chain provide a clean digital to analog transformation based on their bit resolutions. The higher the number of bits, the better the resolution but at a cost of increased power consumption. The mixers implemented in analog circuits are bulky and tend to become expensive as the array size increases. This is where the All-digital transmitters have competitive advantages. The main advantage of the All-digital transmitter is to relax the DACs requirement and also to perform a digital upconversion. FIG. 1B shows the block diagram of an All-digital transmitter. The mixer and DACs are moved inside the digital platform. The beamformer outputs 145 are digitally upconverted through Digital Upconverter block 150.

In conventional transmitter architecture, the efficiency of power amplifiers has also been a critical issue. Switched-mode power amplifiers (SMPAs) have better efficiency compared to the Doherty amplifier. Hence, the output from the digital platform is designed to be 1-bit, namely ON/OFF signals, to control the switch-mode PA operation. The 1-bit outputs from the digital hardware platform 155 are passed to the analog SMPAs through high-speed MGTs. The amplified pulses from the SMPAs 160 are finally subjected to bandpass filtering stage 165 to reconstruct the signal before being radiated by the antennas 170.

However, it has to be noted that digital upconversion and 1-bit quantization possess several challenges. As the bit resolution decreases, the quantization noise gets increased. To address such challenges, several pulse-encoding techniques have been developed in the past. The widely known implementations are the ones based on Sigma-Delta theory.

Literature review suggests there has been very limited prior-art in the areas of All-digital Phased Arrays, especially for the wideband cases. The state-of-art contains a single-beam All-digital beamformer at 2.5 GHz spanning only 25 MHz of bandwidth. The integration of All-digital transmitters with wideband beamformers is needed. Current wideband digital beamformer architectures are based on either true-time delay, FIR filters or Fast Fourier transform (FFT). Although these architectures provide guaranteed stability and excellent linear phase response, they consume greater DSP computational complexity compared to the IIR based architectures. Hence, reduction in digital complexity plays a vital role when our goal is to digitize most of the RF front-end.

There has been previous work of beam filters that provide a wideband response with very low complexity. Multi-dimensional network resonant digital plane wave filters (NR-DPW) are a potential solution. These filters are special kind of wideband array processing algorithms derived based on the concept of multi-dimensional space-time network resonance. They are founded by Bruton and Bartley in 1985 and have been widely employed in receive mode and also been experimentally verified The wideband nature of this beam filter comes from their time-domain approach. They are designed using resistively terminated 2-D continuous domain passive low-pass LC ladder circuit prototypes. Consider the prototype resonant network 200 shown in FIG. 2A. The network resembles the conventional 1-D filter topology corresponding to the temporal frequency domain $s_{ct}$ 205, but extended to another dimension, i.e., the spatial dimension $s_x$ 210. In the prototype network, $X(s_x, s_{ct})$: input Laplace transform
$Y(s_x, s_{ct})$: output Laplace transform
$s_x \in \mathbb{C}$ : spatial Laplace operator
$s_{ct} \in \mathbb{C}$ : temporal Laplace operator
$L_x$, $L_{ct}$, R: parameters that define the filter performance The prototype transfer function in Laplace domain is given by:

$$H(s_x, s_{ct}) = \frac{Y(s_x, s_{ct})}{X(s_x, s_{ct})} = \frac{R}{(R + L_x s_x + L_{ct} s_{ct})} = \frac{R}{(R + L_x \cdot j\omega_x + L_{ct} \cdot j\omega_{ct})} \quad (1)$$

By choosing $L_x = \cos\theta$, $L_{ct} = \sin\theta$ in Eq. (1) the magnitude response 215 of the filter is shown in FIG. 2B. In the magnitude response, the region where the magnitude is non-zero is called the Region of Support (ROS) 220. For the given circuit, ROS lies on a straight line oriented at an angle ($\theta$) 225 to the $\omega_{ct}$ axis, i.e., a beam pointing at an angle $\theta$ in the ($\omega_x, \omega_{ct}$) 2-D domain is formed. For an N-element ULA, a beam pointing at angle $\psi$ from the array broadside is related to angle $\theta$ by the relation $\tan\theta = \sin(\theta)$. Thus, by setting the values of the filter parameters, a beamformer can be implemented to selectively enhance or transmit the desired signal at angle $\theta$. It is also observed from FIG. 2 B that the filter provides a beam at $\psi$ for the entire bandwidth, implying that all the signals within the available bandwidth arriving at the desired angle will be passed and rest attenuated. The 3-D view 230 of the magnitude response is shown in FIG. 2C.

The real-time implementation of the filter needs a difference equation. Thus, the prototype transfer function H $(s_x, s_{ct})$ is converted to a difference equation by first applying a normalized 2-D bilinear transform $$s_k = \frac{(1 - z_k^{-1})}{(1 + z_k^{-1})}, k \in (x, ct)$$

to obtain $$H(z_x, z_{ct}) = \frac{1 + z_x^{-1} + z_{ct}^{-1} + z_x^{-1} z_{ct}^{-1}}{b_{00} + b_{10} z_x^{-1} + b_{01} z_{ct}^{-1} + b_{11} z_x^{-1} z_{ct}^{-1}} \quad (2)$$

where $b_{pq} = \frac{R + (-1)^p L_x + (-1)^q L_{ct}}{R + L_x + L_{ct}}$ followed by applying inverse z-transform under zero initial conditions to yield the difference equation, $$y(n_x, n_{ct}) = \sum_{p=0}^{1} \sum_{q=0}^{1} w(n_x - p, n_{ct} - q) - \sum_{p=0}^{1} \sum_{q=0}^{1} b_{pq} y(n_x - p, n_{ct} - q); \quad (3)$$

$p + q \neq 0$ where $n_x, n_{ct}$ correspond to the antenna index and time sample, respectively.

Figure 3:
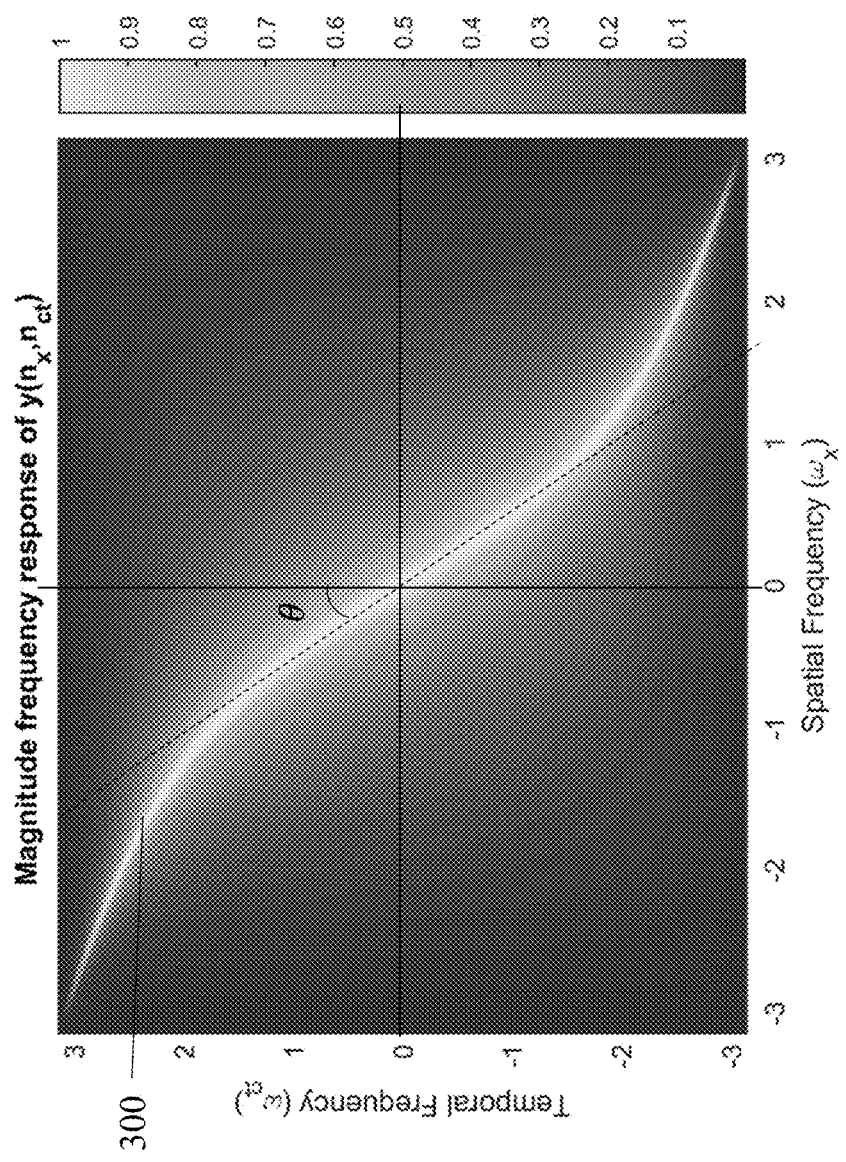
FIG. 3 is a magnitude response of NR-DPW filter obtained using the difference equation $y(n_x, n_{ct})$, according to embodiments of the present invention.

FIG. 3 shows a magnitude response of NR-DPW filter obtained using the difference equation, according to some embodiments of the present invention. In the figure, magnitude response 300 obtained using the difference equation $y(n_x, n_{ct})$ in (3) is shown. Here R=0.001, θ=25°, $N_x$=16, $N_{ct}$=1024 are chosen to compute the filter response. It has to be noted that bilinear transformation introduces warping 305 at higher frequencies, and pre-warping techniques are employed to correct and provide a linear response.

Figure 4:
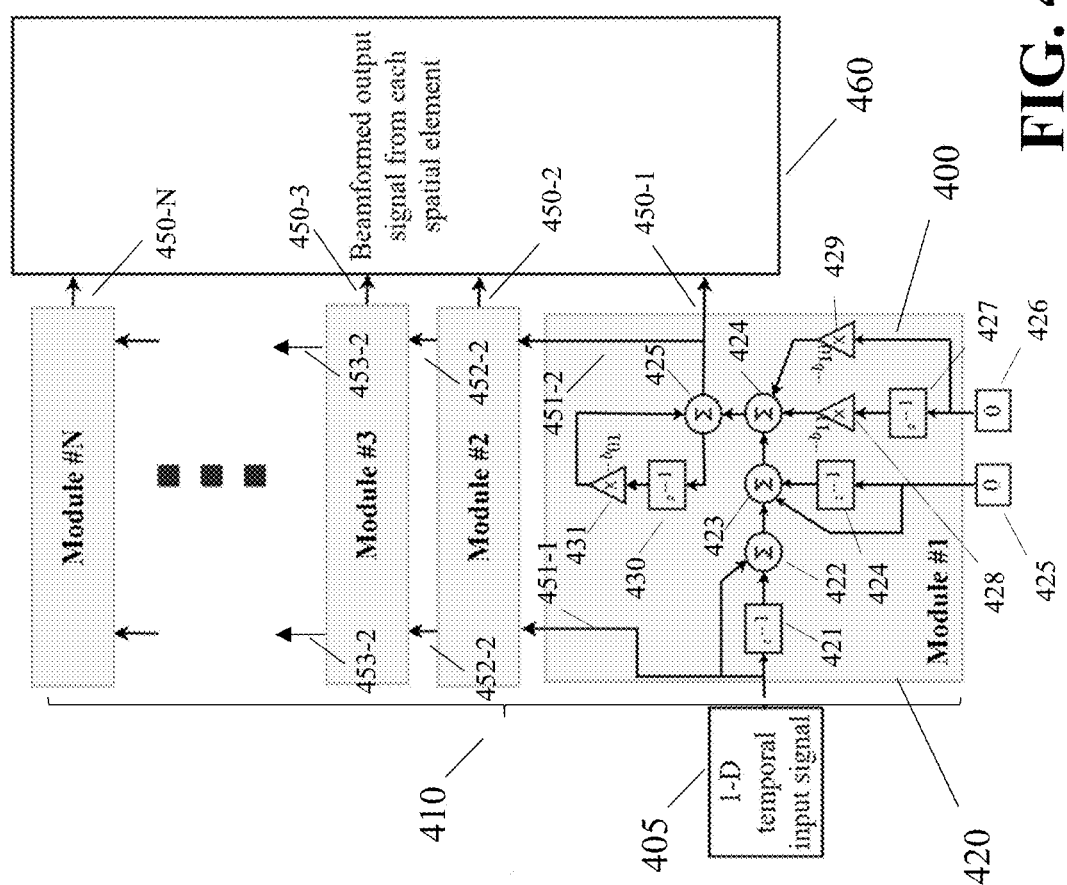
FIG. 4 is a systolic array implementation of the proposed beamformer for N-modules, according to embodiments of the present invention.

FIG. 4 is a systolic array implementation of the proposed beamformer for N-modules, according to embodiments of the present invention. In this case, each module implements the filter's 2D difference equation using Direct form I realization.

The 2-D difference equation in (3) designed using direct-form I realization is shown in FIG. 4. Assume that the filter realization at a spatial location is termed as a filter module. The internal circuit in each module of 420, for instance module #1, 400, comprises of several multipliers (428, 429, 431), adders (423-425), registers (delays) (421, 424, 427, 430), that will perform the required DSP operation corresponding to each spatial location. It can be observed from (3) that, a module processes the incoming signals based on the output of its previous module except for the first module 400 where it needs to be initialized with zeros (425, 426). Thus the realization of difference equation in (3) is achieved by systolic array 410 DSP architectures i.e., massively parallel processing array of identical modules that are interconnected. Such a systolic array implementation provides an output for every DSP clock thus achieving higher speeds and throughput. Since there is only a single time-varying/temporal signal (1-D signal) 405 to be transmitted, and this architecture requires only its first module 4005 to be excited. This contributes to a greater reduction in digital complexity since some of the multipliers in the direct form-I realization can be omitted. The first module (Module #1) 400 receives the 1-D temporal input signal 405, performs one time filter operation and produces an output to feed the antenna 405-1. The input and output of first module are tapped and given to the second module (Module #2) that provides output for antenna 450-2, and the operation is continued for the entire antenna array. The outputs from each module 420 feeding their corresponding antenna element when radiated will form a beam at the desired angle in the far-field region, thus achieving beamforming. The extensive details are omitted here for discussion purpose.

For simulations of the filter design, an input signal with the following specifications is created in simulation (e.g. MATLAB):
  Constellation (M)=16
  Sampling frequency ($F_s$)=10 GHz
  Oversampling ratio (OSR)=10
  Fsym=Fs/OSR
  RRC roll-off factor (RRC)=0.25
  Bandwidth=Fsym (RRC+1)=1.25 GHz
  Number. of bits=16384

FIGS. 5A-5D are spectra of: Baseband test signal with a bandwidth of 1.25 GHz; Upconverted signal at 2.5 GHz; 2-D Beamformer output signal where co-efficients are set to a scan angle of ψ=30° degrees; Side-view of the plot in FIG. 5C plot that shows the beamformer output signal strength vs the temporal frequency. It is noted that the frequency response is normalized to 0 dB. Note that tan θ=sin (ψ).

The spectral density of the input signal 500 is shown in FIG. 5A. The input signal is upconverted to 2.5 GHz (the desired carrier frequency) and the modified spectral density curve 505, as shown in FIG. 5B. It can be observed that the signal is centered at 2.5 GHz and extends over a bandwidth of 1.25 GHz. This temporal signal is applied to the first module of a 16-element filter with zero-initial conditions. The co-efficients of the filter are set to a scanning angle of ψ=30° degrees. The outputs from each spatial element are captured and the 2-D frequency response 515 is plotted and shown in FIG. 5C. FIG. 5D shows the variation of PSD (power spectrum density) vs temporal frequency 520. The results verified that the signal is aligned at the desired angle and is centered at 2.5 GHz with a bandwidth of 1.25 GHz.

This work is based on such filters implemented in an All-digital Transmitter (ADT). It is found that All-digital Transmitter implementation serves as the starting point of this work. ADT at 2.5 GHz with a bandwidth of 1.25 GHz is implemented. The FPGA resource allocation for such an implementation is tremendous and covers 75% of its LUT memory usage. To accommodate the same design for a phased array will be a significant challenge. So the design for an All-digital Phased Array needs an extensive optimization of the design.

Figure 6A:
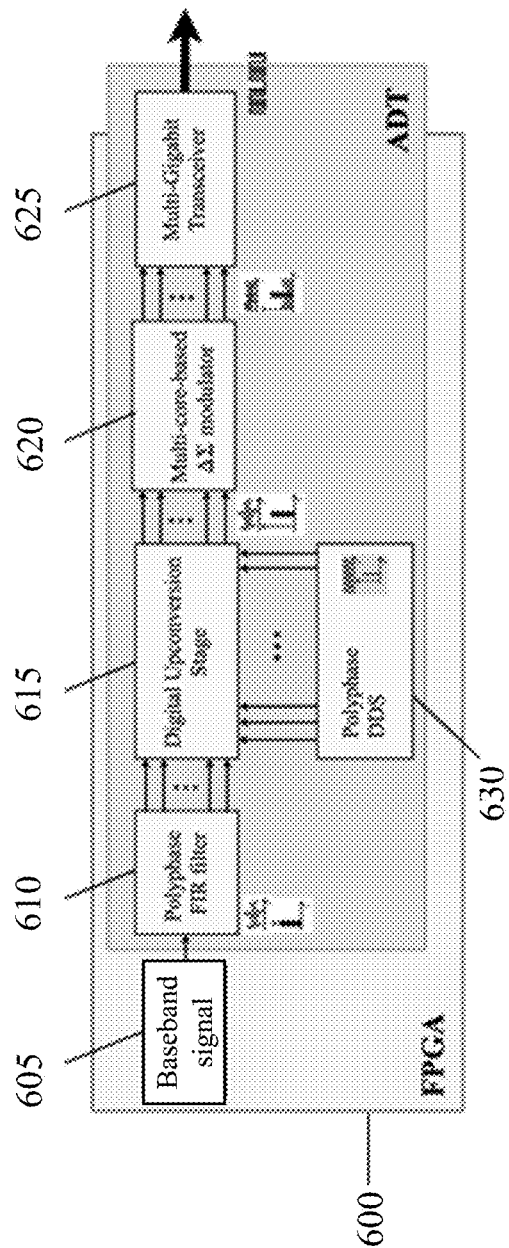
FIG. 6A is a block diagram illustrating the RF-ADT, according to embodiments of the present invention.
Figure 6B:
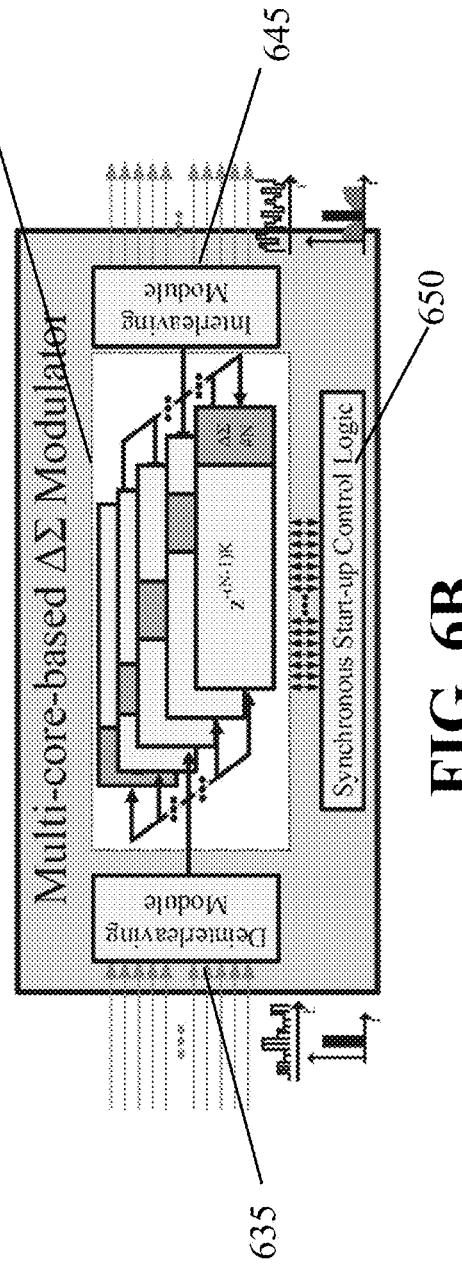
FIG. 6B is a schematic diagram illustrating an internal structure of the multi-core-based $\Delta\Sigma$ modulator, according to embodiments of the present invention.

The block diagram of the ADT 600 implemented is shown in FIGS. 6A and 6B. FIG. 6A shows a block diagram illustrating the RF-ADT and FIG. 6-b is a schematic diagram illustrating an internal structure of the multi-core-based ΔΣ modulator according to some embodiments of the present invention.

The baseband data 605 stored in FPGA memory is divided into several phases using a polyphase FIR filter 610 to achieve higher sampling rates dictated by the serializers on the FPGA. The polyphase digital upconversion (DUC) 615 stage receives the baseband signal and applies a mixing operation with a polyphase Digital Direct Synthesis 630 acting as a LO. The resultant signal is forwarded to the multi-core DSM module 620.

Multi-core DSM module is based on the propagation of state registers. It contains three modules (1) Deinterleaver 635, (2) Parallel DSM modulator 640, and (3) Interleaver 645. The principle of operation is to rearrange and combine the data from different phase paths (performed by Deinterleaver), transmit it to the parallel DSM modulator, and finally rearranging and combining back to the polyphase paths (performed by Interleaver). For an N-core DSM module, the Deinterleaver breaks the input signal into N blocks of size K where each core of the parallel DSM modulator operates on K sequential samples. To avoid any discontinuity in state propagation, the incoming and outgoing data are delayed in each path, and a synchronous control logic 650 manages the flow of data between the modulators. The accuracy can be improved with an increase in values of K and N. The resulting data from the Multi-Core DSM module is finally serialized and converted to analog using the Multi-Gigabit Transceivers 625.

Figure 7:
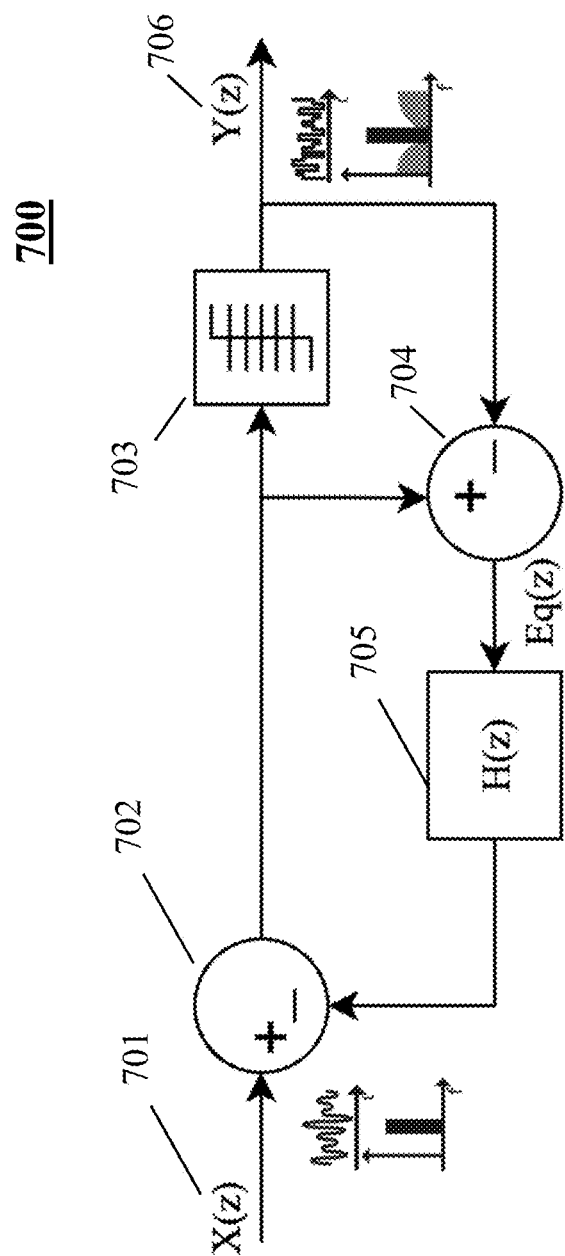
FIG. 7 show an architecture of an Error-feedback $\Delta\Sigma$ modulator realized in z-domain, according to embodiments of the present invention.

FIG. 7 shows an architecture of an Error-feedback ΔΣ modulator realized in z-domain, according to embodiments of the present invention. Each core of the parallel DSM modulator contains a generic error-feedback DSM architecture 700, as shown in FIG. 7, with X(z) 701 the input signal, adder 702, 704, and comparator 703, output signal Y(z) 706. H(z) 705 is the feedback loop transfer function. The same has been employed for this embodiment.

Figure 8:
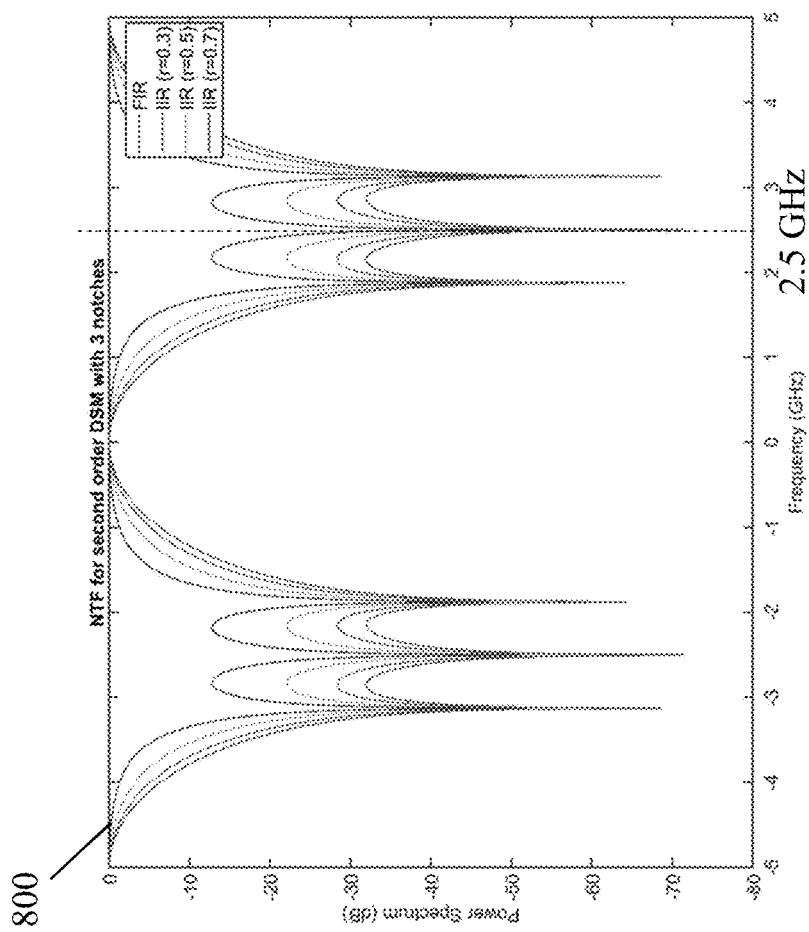
FIG. 8 shows a noise transfer function frequency response for different filter realizations, according to embodiments of the present invention.

The transfer function of such a filter is given by, $$Y(z) = STF(z)X(z) - NTF(z)E_q(z) = STF(z)X(z) - (1+H(z))E_q(z) \quad (4)$$

where STF(z) is Signal transfer function,
NTF(z)=1+H(z) is the noise transfer function,
H(z) is the feed-back loop transfer function Here, the quantization noise is modeled by a random noise signal NTF(z) and can be either an FIR or an IIR filter. From simulations, it was observed that the FIR filter with two quantization levels led to the unstable realization, and hence an IIR filter is opted. IIR filters are developed from FIR filters by introducing complex poles that closely follow the zeros of the original FIR transfer function. However, the IIR filters reduce the operational bandwidth, and to accommodate the proposed bandwidth of 1.25 GHz, the number of zeros that create notches in the filter response has to be increased and uniformly distributed into the desired bandwidth. The noise transfer function (NTF) for a three notch IIR filter for a second-order bandpass DSM modulator is given by, $$NTF(z) = \frac{1+\alpha z^{-1} + z^{-2}}{1 + r\alpha z^{-1} + r^2 z^{-2}} \cdot \frac{1 + \beta z^{-1} + z^{-2}}{1 + r\beta z^{-1} + r^2 z^{-2}} \cdot \frac{1 + \gamma z^{-1} + z^{-2}}{1 + r\gamma z^{-1} + r^2 z^{-2}} \quad (5)$$

where $$\alpha = -2\cos\left(\frac{2\pi F_{C1}}{F_S}\right); \beta = -2\cos\left(\frac{2\pi F_{C2}}{F_S}\right); \gamma = -2\cos\left(\frac{2\pi F_{C3}}{F_S}\right);$$

with $F_{c1}$, $F_{c2}$, $F_{c3}$ as notch frequencies and $F_s$ as modulator sampling frequency. Each pole closely follows zero with a scaling factor r (0<r<1). The simulation for NTF(z) for different filter realizations 800, are shown in FIG. 8. Filter notch responses are selected such that the operational bandwidth is 1.25 GHz with a center frequency at 2.5 GHz. The sampling frequency is chosen to be 10 GSps to maintain an oversampling factor of 4. From the simulation, it is observed that the value of r decides the tradeoff between the bandwidth and the impact of notches.

The feedback loop transfer function H (z) can be computed from Eq. (4) and Eq. (5) and is given by:

$$H(z) = \frac{A_1 z^{-1} + B_1 z^{-2} + C_1 z^{-3} + D_1 z^{-4} + E_1 z^{-5} + F_1 z^{-6}}{1 + F_0 z^{-1} + G_0 z^{-2} + H_0 z^{-3} + I_0 z^{-4} + J_0 z^{-5} + K_0 z^{-6}} \quad (6)$$

where A1=(α+β+γ)(1−r), B1=(3+αβ+γ(α+β))(1−r²), C1=(2(α+β)+γ(2+αβ))(1−r³), D1=(3+αβ+γ(α+β))(1−r⁴), E1=(α+β+γ)(1−r⁵) and F1=(1−r⁶) Thus, the multi-core second-order bandpass DSM modulator is designed using the IIR feedback loop transfer function H (z) shown in Eq. (6).

To develop the All-digital Phased Array from the ADT, the beam filter design has to be integrated. This brings another challenge, since the beam filter has its signal flow diagram defined only for single core (single phase) which cannot be clocked above 300 MHz typically on an FPGA. Thus, it has to be modified for a polyphase implementation to be transmitted using MGTs serializer rate of 10 GSps.

Figure 9:
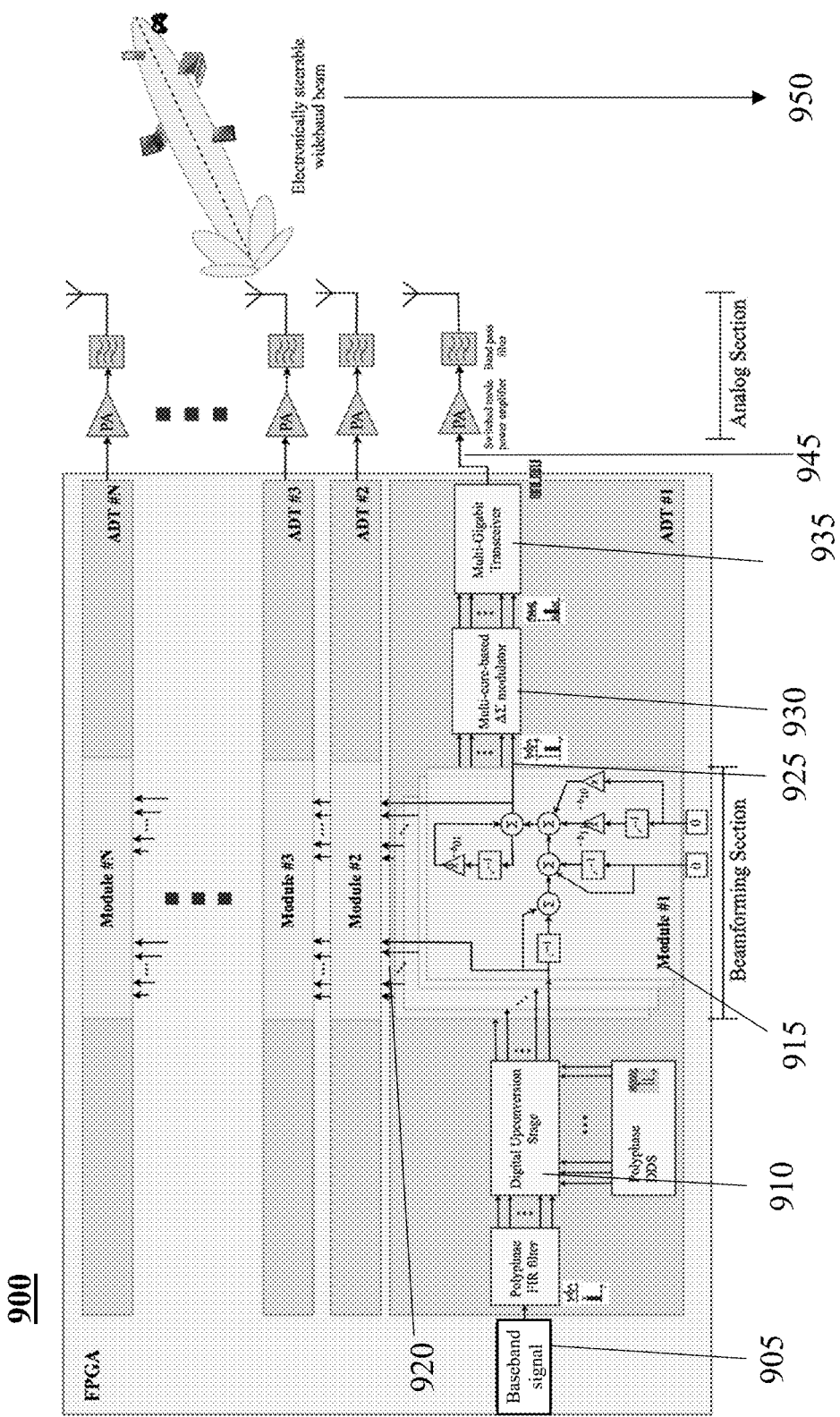
FIG. 9 is a schematic diagram illustrating the architecture for the All-Digital Phased Array, according to embodiments of the present invention.

The current RF ADT for single element is modified, and the proposed N element All-digital Phased Array 900 is shown in FIG. 9. Since the beam filter requires the sequential data from the incoming polyphase data, the temporal upconverted baseband samples 905 are now passed to 635 Deinterleaver before passing to the beam filter 915. The rearranged samples from the Deinterleaver are given to each core of Multi-Core Beam filter Design of 915, where each core contains the similar direct-form I realization of the beam filter's difference equation as shown in FIG. 4 (single core case). However, for the systolic array implementation of the beam filter where the modules are interconnected, outputs from each core of a module, for instance Module #1 output 920 are passed to the respective core of the next module, such like Module #2. Namely, core 1 of module #1 feeds the input to core 1 of module #2, core 1 of module #2 feeds the input to core 1 of module #3 and so on. Beamformed outputs 925 from each module of the multi-core beam filter are passed to the Multi-core DSM modulator 930 to perform the bit quantization and noise shaping. The output from the DSM modulator is interleaved into polyphases by passing through a 645 Interleaver and the resulting data is finally transmitted out of digital platform as high rate binary pulses using MGTs 935. The high speed binary pulses from each module 945 are then signal shaped (amplified and bandpass filtered) and fed to their corresponding antenna to provide a beam 950 at a desired angle in the array's farfield. It has to be mentioned that due to the filter architecture, we only need one digital upconversion stage 910 for the N-element array leading to a great reduction in hardware resources.

For proof of concept verification, All-digital Phased Array of 8-elements at 2.5 GHz supporting 1.25 GHz bandwidth is implemented. To validate the proposed design, a ZCU 1287 board featuring XCVU095 FPGA maybe selected. The serializer rate is chosen to be 10 GSps for this work. The output rate of the serializers is a production of the number of phases/cores times the clocking rate of each phase/core. The number of phases is dependent upon the FPGA logic clock, which internally depends upon the critical path of the entire digital design.

The single-core designs of beam filter and DSM modulator are compiled and are capable of clocking at 290 MHz. MGTs on the FPGA board can only be configured at either 64, 40, 32, or 16 phases. Adhering to these requirements, a 40 polyphase version with 2 output levels is planned and each core needs to be clocked at 250 MHz. However, as the design got complicated for a polyphase version, 250 MHz was not achievable with the original designs. Thus the timing closure required (1) fine-grain pipelining (2) decreasing the bit-widths wherever applied without significant effect on the performance (3) decreasing the fanout count on certain blocks. Some other optimization techniques followed were: the FIFOs for the interleaver and deinterleaver modules replaced by MUXs-delay architecture; for particular frequency choices α=−β, γ=0 in Eq. (5), thus circuit complexity especially the multiplier count is reduced by more than 50% and led to a greater reduction in digital complexity.

Figure 10B:
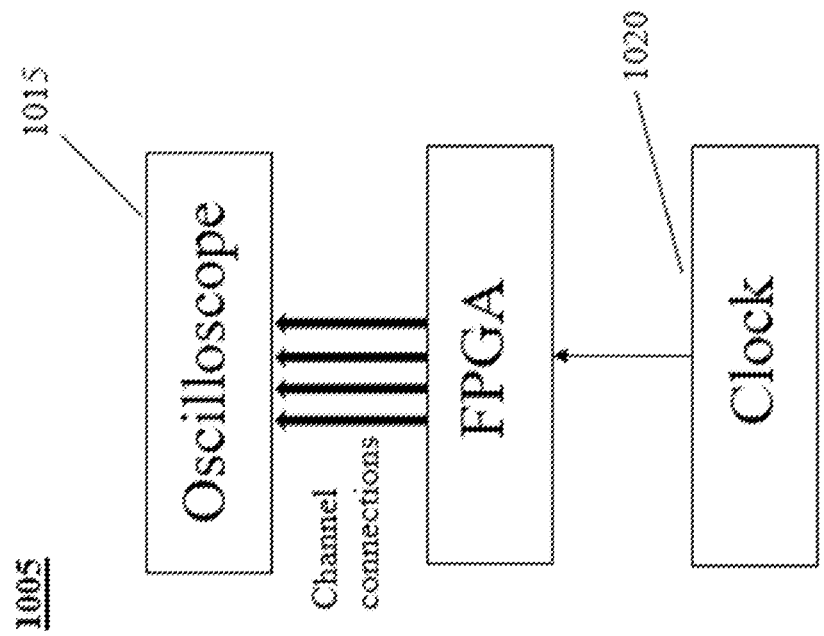
FIG. 10B shows an experimental hardware setup, according to embodiments of the present invention.
Figure 10A:
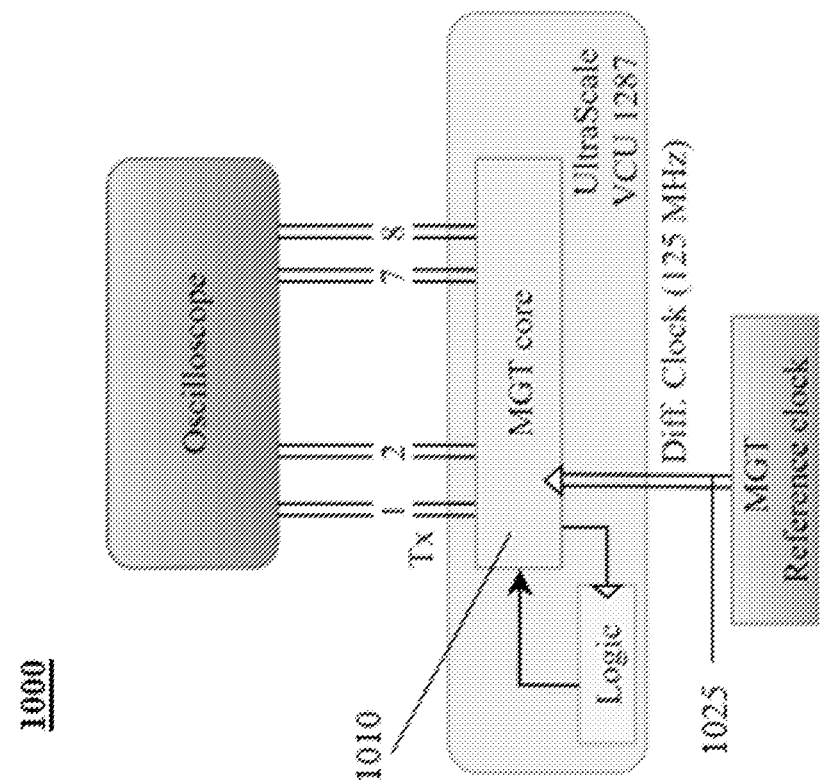
FIG. 10A is a verification Setup block diagram, according to embodiments of the present invention.

An 8-element All-digital Phased array clocking at 250 MHz with 40 phases is implemented in the FPGA. The 2-level output from the 40 phases from 8 channels are serialized through MGTs that are configured to 10 GSps. Due to limitations of an anechoic chamber, the proposed work is verified offline using an oscilloscope. The setup block diagram 1000 and the experimental setup 1005 for verification of the proposed work are shown in FIG. 10. Quads Q228 and Q229 in the MGT core 1010 are utilized to transmit the signals out a 4-port real-time oscilloscope (Keysight DSA-X 92504Q) 1015. Tektronix AWG610 1020 provides the 125 MHz FPGA differential reference clock 1025. Due to the challenge of measuring all 8-channels at once, one channel is used as reference to provide the synchronization between the channels. The measurement sequence included the acquisition of data in the following manner Test 1: Ch1, Ch2, Ch3, Ch4
Test 2: Ch1, Ch5, Ch6, Ch7
Test 3: Ch1, Ch8

Figures 11A, 11B:
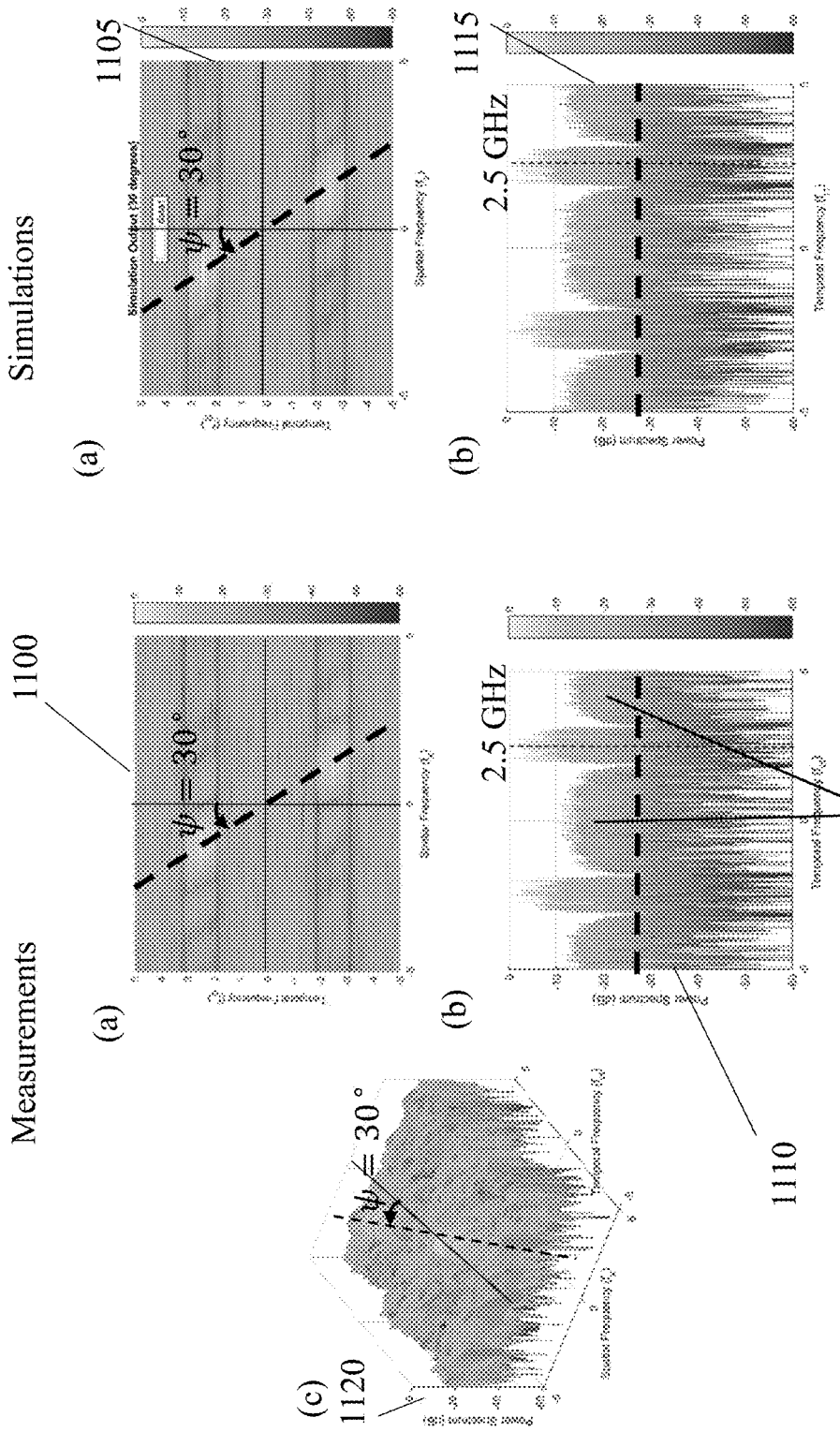
FIGS. 11A and 11B show comparison of measured and simulated 2-D spectra for the 8-element all digital phased array for the case of $\psi=30°$, according to embodiments of the present invention.

FIGS. 11A and 11B show comparison of measured and simulated 2-D spectra for the 8-element all digital phased array for the case of ψ=30°, according to embodiments of the present invention. In this case, calibration of all the channels is achieved by transmitting a pre-known data. The beamformed signals from all the channels are captured in the scope memory, and signal analysis is performed in computer using Matlab software. The 2-D frequency responses ($\omega_x$ vs $\omega_{ct}$) from the measured data 1100 and simulation 1110 are shown in FIG. 11A, indicated by (a) and 11.2(a) respectively. Gain vs $\omega_{ct}$ measured response 1110 is shown in 11.1B, and simulated response 1115 corresponding to (b), 3D view for the measured response 1120 is indicated by (c) of FIG. 11A). The noise is quantized to out of the band, and the levels in measurements and simulations were reported to be −28 and −29 dB respectively.

Figure 12:
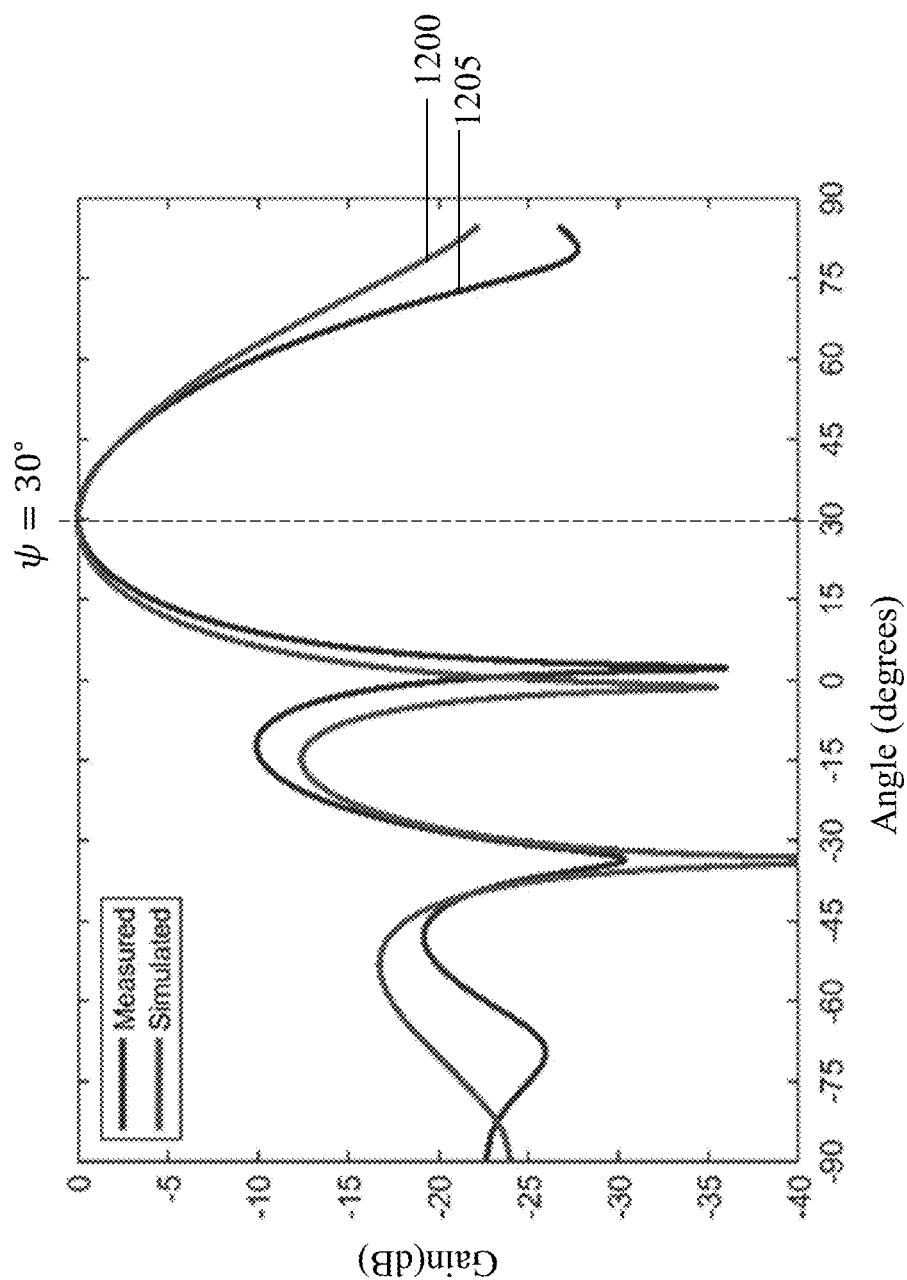
FIG. 12 shows the comparison of simulated vs measured beam pattern at 2.5 GHz, according to embodiments of the present invention.

FIG. 12 shows a comparison of the measured and simulated 2-D spectra for the 8-element all digital phased array according to embodiments of the present invention. FIG. 12 shows a comparison of the measured and simulated 2-D spectra for the 8-element all digital phased array according to embodiments of the present invention. The plots of the figure show the case of ψ=30°, $\omega_x$ vs $\omega_{ct}$ for measured in 1(a) and for simulated in 2(a) respectively; Gain vs $\omega_{ct}$ for measured in 1(b) and for simulated in 2 (b); 3D view for the measured response.

The beam performance of the implementation can be evaluated by plotting the beampattern. For the filter design, the filter coefficients were set to ψ=30. To plot the beampattern, the quantization noise has to removed first, and a bandpass filter is implemented in Matlab for the required band. The comparison of simulated 1200 and measured beampatterns 1205 for f=2.5 GHz is shown in FIG. 12. The simulations values are obtained from the fixed point design captured in Matlab Simulink. The measured and simulated results are reported in the following table:

| Parameter | Measured | Simulated |
|---|---|---|
| ψ (deg) | 30 | 30 |
| PSL (dB) | −10 | −12.5 |

From the results, it can be noted that the simulation and measured results are in good agreement. The degradation in side-lobe level is assumed to occur due to measurement imperfections.

The design captured in Matlab Simulink is imported to Vivado to find the timing and resource allocation from the implemented netlist. The figures of merit are mentioned in the below tables:

| Timing | Frequency |
|---|---|
| 3.96 ns | 252.5 MHz |

| Resource | Utilization | Available | % |
|---|---|---|---|
| LUT | 215609 | 537600 | 40.1 |
| LUTRAM | 39924 | 76800 | 52 |
| FF | 126053 | 1075200 | 11.7 |
| IO | 8 | 702 | 1.1 |
| GT | 8 | 64 | 12.6 |
| BUFG | 3 | 960 | 0.3 |
| PLL | 1 | 32 | 3.13 |

The power analysis results were reported, as shown below:

| Type | Power (W) |
|---|---|
| Static | 1.3 |
| Dynamic | 14.1 |
| GTH | 1.2 |
| Total On-chip | 16.6 |

The above-described embodiments of the present disclosure can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Also, the embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments. Further, use of ordinal terms such as first, second, in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

The invention claimed is:

1. An all-digital transmitter (ADT) comprising:
   a baseband interface configured to store and transmit an (baseband) input signal at a corresponding frequency band;
   a polyphase finite impulse response (FIR) filter configured to receive and convert the baseband input signal (samples) into different phases;
   a digital upconverter configured to upconvert each of the different phase baseband input signal to a predetermined carrier frequency in a digital domain;
   a set of multi-core 2-dimensional (2D) network-resonant digital plane wave (NR-DPW) beamfilters, wherein each of the multi-core 2D NR-DPW beamfilters includes a low-pass LC-ladder circuit, wherein each of the multi-core 2D NR-DPW beamfilters is configured to transmit the upconverted baseband input signal by a target angle;
- a multi-core delta-sigma modulator (DSM) configured to encode the upconverted input signal into pulsating signals; and
- a serializer configured to serialize the encoded pulsating signals into a RF bitstream.

2. The ADT of claim 1, wherein the DUC performs a mixing operation by applying the baseband data to a polyphase Digital Direct Synthesis (DDS) unit.

3. The ADT of claim 1, wherein the multi-core beam filter comprises: input ports configured to acquire upconverted digital signals having different phases, wherein a number of the input ports is identical to a number of the phases of the upconverted digital signals;
- a set of multi-core 2-dimensional (2D) network-resonant digital plane wave (NR-DPW) beamfilters connected to the input ports, wherein a number of the multi-core 2D NR-DPW beamfilters is identical to the number of phases; and
- output ports connected to the 2D NR-DPW beamfilters, wherein each of the output ports is connected to one of input ports of a multi-core-DSM modulator.

4. The ADT of claim 3, wherein each of the multi-core 2D NR-DPW beamfilters is configured to have filter parameters to transmit signals at the target angle.

5. The ADT of claim 3, wherein the multi-core 2D NR-DPW beamfilters are arranged to at least two modules.

6. A multi-core beamforming circuit comprising:
- input ports configured to acquire upconverted digital signals having different phases, wherein a number of the input ports is identical to a number of the phases of the upconverted digital signals;
- a set of multi-core 2-dimensional (2D) network-resonant digital plane wave (NR-DPW) beamfilters connected to the input ports, wherein a number of the multi-core 2D NR-DPW beamfilters is identical to the number of phases; and
- output ports connected to the 2D NR-DPW beamfilters, wherein each of the output ports is connected to one of input ports of a multi-core-DSM modulator.

7. The multi-core beamforming circuit of claim 6, wherein each of the multi-core 2D NR-DPW beamfilters is configured to have filter parameters to transmit signals at the target angle.

8. The multi-core beamforming circuit of claim 6, wherein the multi-core 2D NR-DPW beamfilters are arranged to at least two modules.

9. The multi-core beamforming circuit of claim 8, wherein the at least two modules are configured recursively as a parallel processing array.

10. The multi-core beamforming circuit of claim 8, wherein outputs from one of the at least two modules are passed to a next stage of another module.

11. The multi-core beamforming circuit of claim 6, wherein each of the multi-core 2D NR-DPW beamfilters includes a low-pass LC-ladder circuit.

12. An all-digital transmitter (ADT) comprising:
- a baseband interface configured to store and transmit an (baseband) input signal at a corresponding frequency band;
- a polyphase finite impulse response (FIR) filter configured to receive and convert the baseband input signal (samples) into different phases;
- a digital upconverter configured to upconvert each of the different phase baseband input signal to a predetermined carrier frequency in a digital domain;
- a set of multi-core 2-dimensional (2D) network-resonant digital plane wave (NR-DPW) beamfilters, wherein each of the multi-core 2D NR-DPW beamfilters is configured to transmit the upconverted baseband input signal by a target angle;
- a multi-core delta-sigma modulator (DSM) configured to encode the upconerted input signal into pulsating signals, wherein the multi-core beam filter comprises:
    - input ports configured to acquire upconverted digital signals having different phases, wherein a number of the input ports is identical to a number of the phases of the upconverted digital signals;
    - a set of multi-core 2-dimensional (2D) network-resonant digital plane wave (NR-DPW) beamfilters connected to the input ports, wherein a number of the multi-core 2D NR-DPW beamfilters is identical to the number of phases; and
    - output ports connected to the 2D NR-DPW beamfilters, wherein each of the output ports is connected to one of input ports of a multi-core-DSM modulator; and
- a serializer configured to serialize the encoded pulsating signals into a RF bitstream.

13. The ADT of claim 12, wherein each of the multi-core 2D NR-DPW beamfilters is configured to have filter parameters to transmit signals at the target angle.

14. The ADT of claim 12, wherein the multi-core 2D NR-DPW beamfilters are arranged to at least two modules.

* * * * *